United States Patent [19]

Krishna et al.

[11] Patent Number: 4,804,634

[45] Date of Patent: Feb. 14, 1989

[54] INTEGRATED CIRCUIT LATERAL TRANSISTOR STRUCTURE

[75] Inventors: Surinder Krishna, Fremont; Amolak R. Ramde, San Jose, both of Calif.

[73] Assignee: National Semiconductor Corporation, Santa Clara, Calif.

[21] Appl. No.: 132,689

[22] Filed: Dec. 14, 1987

Related U.S. Application Data

[63] Continuation of Ser. No. 564,778, Dec. 27, 1983, abandoned, which is a continuation of Ser. No. 257,290, Apr. 24, 1981, abandoned.

[51] Int. Cl.$^4$ ............................................. H01L 21/20
[52] U.S. Cl. ...................................... 437/32; 437/143; 437/150; 437/160; 437/164; 437/917; 357/35; 357/90
[58] Field of Search ...................... 437/27, 31, 32, 59, 437/98, 143, 150, 160, 168; 357/35, 90; 148/DIG. 33, DIG. 34

[56] References Cited

U.S. PATENT DOCUMENTS

| | | | |
|---|---|---|---|
| 2,878,152 | 3/1959 | Runyan et al. | 357/63 |
| 3,615,939 | 10/1971 | Schneider | 357/35 |
| 3,615,945 | 10/1971 | Yokozawa | 437/143 |
| 3,704,399 | 11/1972 | Glaise | 357/35 |
| 3,873,989 | 3/1975 | Schinella et al. | 357/35 |
| 3,914,138 | 10/1975 | Rou-Choudhury | 437/143 |
| 3,919,006 | 11/1975 | Tarui et al. | 357/35 X |
| 3,943,555 | 3/1976 | Mueller et al. | 357/35 X |
| 3,972,741 | 8/1976 | Anlhony et al. | 437/160 |
| 4,005,451 | 1/1977 | Martinelli et al. | 357/35 X |
| 4,038,106 | 7/1977 | Kawamoto | 437/160 |
| 4,050,967 | 9/1977 | Rosnowski et al. | 437/143 |
| 4,099,997 | 7/1978 | Rosnowski | 437/143 |
| 4,216,038 | 8/1980 | Nishisawa et al. | 437/160 |
| 4,263,067 | 4/1981 | Takahashi et al. | 437/164 |
| 4,283,236 | 8/1981 | Sirsi | 357/35 X |
| 4,314,267 | 2/1982 | Bergeron et al. | 357/35 X |
| 4,419,685 | 12/1983 | Sugawara et al. | 357/35 |
| 4,426,234 | 1/1984 | Ohshima et al. | 437/143 |

FOREIGN PATENT DOCUMENTS

| | | | |
|---|---|---|---|
| 55-53456 | 7/1980 | Japan | 357/34 |
| 0206174 | 12/1983 | Japan | 437/143 |
| 1054360 | 1/1967 | United Kingdom | 437/143 |
| 1199399 | 7/1970 | United Kingdom | 437/143 |

OTHER PUBLICATIONS

M. D. Cowan et al., "Compatible Lateral PNP and Doubled-Diffused NPN Devices", *IBM Technical Disclosure Bulletin*, vol. 13 (1970) pp. 939–940.

*Primary Examiner*—Brian E. Hearn
*Assistant Examiner*—Tom Thomas
*Attorney, Agent, or Firm*—Gail W. Woodward; Lee Patch; Mark Aaker

[57] ABSTRACT

In a monolithic silicon integrated circuit fast diffusing impurities are incorporated into the collectors of the bipolar lateral transistors. The impurity level is controlled, using ion implantation, so that after device processing the lateral transistor collectors extend an additional increment into the base. This increment is doped with the fast diffusing impurity at a level that overcompensates the normal base impurity to the opposite conductivity type and conductivity about equal to that of the base. Thus the collector junction is moved towards the emitter and is symmetrical in terms of conductivity. This means that when the collector is reverse biased the depletion field extends about equally on both sides of the junction. This action greatly relieves the voltage gradient and stress so that collector junction voltage breakdown is enhanced. Since the collector junction is closer to the emitter the transistor current gain and frequency response are enhanced.

5 Claims, 1 Drawing Sheet

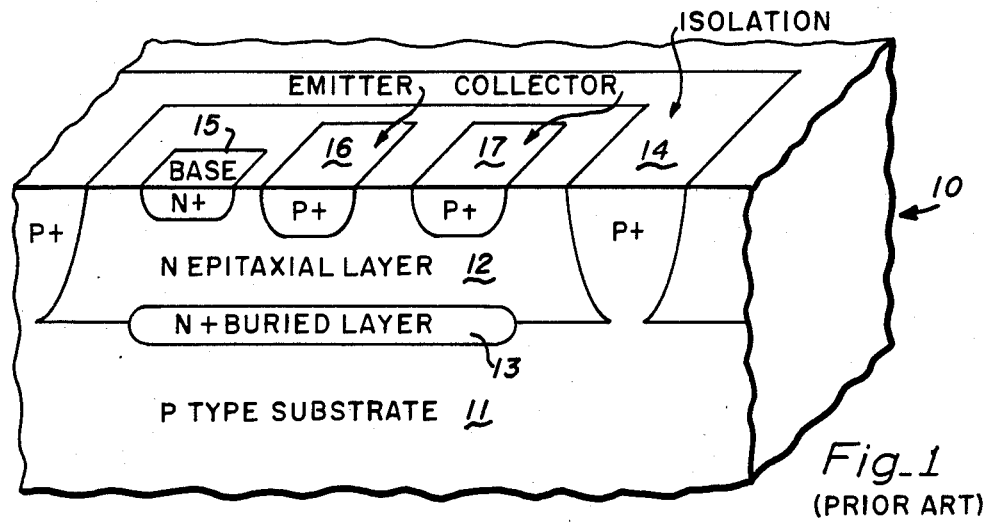
Fig_1 (PRIOR ART)
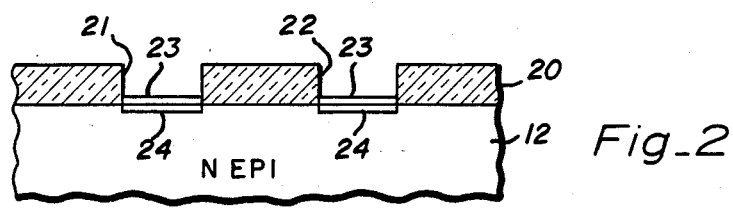
Fig_2
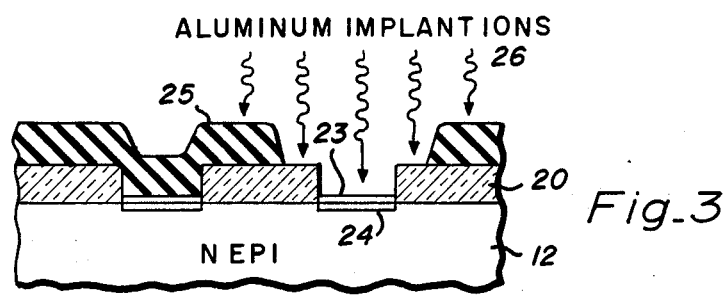
Fig_3
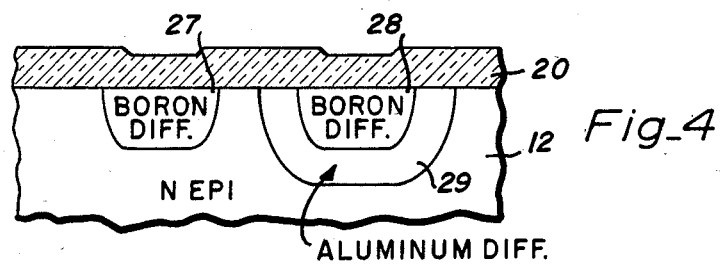
Fig_4
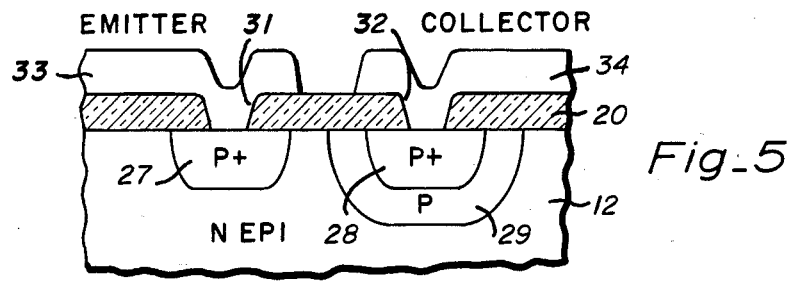
Fig_5

INTEGRATED CIRCUIT LATERAL TRANSISTOR STRUCTURE

This is a continuation of co-pending application Ser. No. 564,778, filed on Dec. 27, 1983, abandoned, which is a continuation of application Ser. No. 257,290, filed on Apr. 24, 1981, abandoned.

BACKGROUND OF THE INVENTION

The invention is related to the conventional monolithic silicon integrated circuit (IC) art and is particularly directed to the lateral bipolar junction transistor (BJT) structures used therein. Typically in an IC the BJT structures are vertically constructed to create NPN transistors. If desired, vertically arrayed PNP transistors can be incorporated, but their collectors are dedicated or permanently connected to the IC substrate. This imposes an undesirable design constraint that is normally avoided by the use of laterally constructed PNP transistors. Such lateral construction, while providing uncommitted collectors, has other constraints that are troublesome. These include relatively low current gain, breakdown voltage, and frequency response.

SUMMARY OF THE INVENTION

It is an object of the invention to improve the collector action in lateral transistors by incorporating fast diffusing impurities therein.

It is a further object of the invention to extend the collector of a lateral transistor further into the base using a fast-diffusing impurity in an over-compensated concentration that approximates that of the base.

These and other objects are achieved by incorporating aluminium impurities into the lateral transistor collector along with the normally used boron. Typically in IC fabrication the lateral transistors are created while the NPN transistor bases are being formed. The lateral emitters and collectors are simultaneously boron diffused during the conventional NPN transistor base formation. In accordance with the invention aluminium is added to the boron doped collectors, preferably by ion implantation, just after the boron base predeposition normally employed. Ion implantation is the preferred method because it provides a precise control over the amount of aluminum employed. After the diffusion drive in step which normally follows predeposition, the boron diffuses into the silicon but the aluminium will diffuse faster, thereby providing an aluminium doped region that extends beyond the boron doped region. The amount of aluminum is selected so as to overpower the base impurities and to dope the aluminium rich region to about the resistivity of the base. This creates a symmetrical collector PN junction in which the depletion region, that results from collector biasing, will extend equally on both sides of the junction. This action relieves the voltage stress in the collector so that a high breakdown voltage is achieved. Since the aluminum rich region extends beyond the normal collector, the PN junction is pushed closer to the emitter thereby reducing the transistor base width. This increases the transistor current gain and frequency response along with the current level at which the peak current gain is observed.

BRIEF DESCRIPTION OF THE DRAWING

FIG. 1 is a cross section partial front elevation of a fragment of an IC containing a prior art lateral transistor.

FIGS. 2-5 are cross section fragments of an IC showing the steps used in the invention.

DESCRIPTION OF THE PRIOR ART

FIG. 1 shows a typical prior art lateral transistor as is typically employed in a monolithic silicon IC. The normally encountered planar oxide and metallization have been omitted for clarity. Fragment 10 is a portion of an IC chip in which a lateral transistor is contained. The structure is fabricated on a P type substrate wafer 11 which is typically 15 to 20 mils thick and of about 4 ohm centimeter resistivity. An epitaxial layer 12 is grown on the wafer to a typical thickness of about 10 to 15 microns and has an N type dopant such as arsenic at a level of about $10^{15}$ atoms per cc. The structure includes a heavily dope buried layer 13 which has a conductivity of about 20–30 ohms per square. The device is ringed by an isolation diffusion 14 which extends completely through layer 12 so as to electrically isolate a tub of N type epitaxial material.

It is to be understood that the drawing is not to scale but is exaggerated vertically to better illustrate the structure. While layer 12 is shown thick relative to the device electrode size, it is actually very thin. Also, in the interest of clarity, the well-known planar oxide and contact metallization are omitted in FIG. 1.

Base contact 15 makes ohmic contact to the isolated N type tub. It is typically an NPN transistor emitter which is heavily doped N+ type. Emitter 16 and collector 17 are P type diffusions, typically boron, that are formed while the NPN transistor bases are formed. hese are commonly about 3 microns deep with a surface concentration of boron of about $2 \times 10^{18}$ atoms per cc.

The emitter and collector are shown as closely confronting side by side structures. In this configuration the intervening N type material acts as the transistor base. Other geometries can be used. In one commonly used structure, the emitter will be round with a spaced ring collector. If desired, a plural collector structure can be employed wherein a single emitter operates several independent collectors through a commonly connected base. The invention to be described hereinafter will apply to the collector or collectors if a plural structure is employed.

In operation the emitter electrode 16 is forward biased with respect to the N type base. It therefore emits minority charge carriers (holes) into the base where they diffuse away from the emitter. When the holes encounter the depletion region surrounding the collector 17, due to its normally applied reverse bias, they will be collected so as to flow as collector current.

DESCRIPTION OF THE INVENTION

FIGS. 2 through 5 show the steps that are employed to practice the invention. These drawings illustrate a fragment of an IC wafer being processed in a conventional IC fabrication process. While it is not shown, it is to be understood that the structure of FIGS. 2-5 overlie a conductive insert as shown in FIG. 1 and there is also an ohmic base contact as shown.

Referring now to FIG. 2, a segment of an epitaxial layer 12 is shown having a planar oxide 20 grown thereon. Typically the oxide 20 will be about 0.5 micron thick. Holes 21 and 22 have been photolithographically cut into oxide 20 where a lateral transistor is to be created. Hole 21 is located where an emitter is to be established and hole 22 is located where a collector is to be established. In the normal course of IC fabrication where a P type NPN transistor base is to be created a boron predeposition step is done. Here a boron rich atmosphere is brought into contact with the wafer at high temperature. This creates a thin boron rich glass 23 and a boron rich silicon surface 24. Normally the boron would then be diffused to complete the lateral transistor. However, in accordance with the invention and prior to diffusion, aluminium is applied as shown in FIG. 3.

First the emitters are covered with a resist 25. As a practical matter the entire wafer is covered with resist and holes are opened in loose registration with the collectors. It is merely necessary to create a resist hole that is slightly larger than the oxide cut 22. The wafer is then bombarded with aluminum ions 26 at an energy that will cause them to penetrate oxide 23. Thus region 24 will now be doped with boron and aluminum. The regular oxide 20 or resist 25 will act to shield the silicon from the aluminium ions.

Then the resist 25 is removed and the wafer is subjected to the normal base diffusion. During this step the boron will diffuse in as shown in FIG. 4 to create emitter 27 and collector 28. At the same time the aluminium will diffuse to a greater extent to create collector region 29 which extends beyond boron region 28. The actual collector junction will be located at the edge of region 29. The aluminium implant of FIG. 3 is controlled to deposit an amount of aluminum selected to dop region 29 to the desired level. The level is normally selected to dope the silicon P type which means that enough aluminium is present to overcompensate the N type impurities in layer 12. The P type final doping is further selected to impart a resistivity approximating the N type doping of layer 12 so that a symmetrical collector junction is created. This means that when the collector is reverse biased, the depletion region will extend equally on both sides of the junction. In the prior art devices, where the conventional NPN transistor base diffusion alone comprises the lateral transistor collector, as shown above under the Description of the Prior Art, the doping is unequal so that the depletion region extends almost solely into the lateral transistor base. In effect the NPN transistor base diffusion produces a relatively abrupt junction that is much more heavily doped in its diffused portion than the material it is facing.

Since the diffusion step is commonly achieved in an oxidizing atmosphere at high temperature, the oxide regrows over the diffused regions as shown in FIG. 4. This characteristic is typical of the well-known planar process. In subsequent processing as shown in FIG. 5 holes are photolithographically cut through the oxide at 31 and 32 and the wafer covered with a layer of metallization. The metallization layer is photolithographically etched to create the IC interconnect pattern which includes the lateral transistor emitter contact 33 and the collector contact 34.

EXAMPLE

The invention was applied to conventional IC wafers so that modified lateral transistors could be compared with conventional prior art units. Conventional processing was used for IC fabrication. In the ion implant step of FIG. 3 aluminum ions were implanted at about 200 kev energy to a dose of about $10^{14}$ atoms per square centimeter. The following chart compares the results.

| Parameter | Prior Art Device | Device of the Invention |
|---|---|---|
| Beta (at 1 microampere) | 140 | 200 |
| Beta (at 10 microamperes) | 174 | 235 |
| Beta (at 100 microamperes) | 125 | 175 |
| Beta (at 1 milliampere) | 24 | 33 |
| $LV_{CEO}$ | 70 Volts | 87 Volts |
| $BV_{CBO}$ | 94 Volts | 96 Volts |
| $f_T$ (at 10 microamps) | 2.5 MHz | 4.5 MHz |

Where Beta is the transistor base to collector current gain, $LV_{CEO}$ is the pulsed limiting breakdown voltage, $BV_{CBO}$ is the collector-emitter breakdown voltage with the base open circulated, and $f_t$ is the maximum frequency of oscillation.

It can be seen that there is a substantial improvement in Beta at all current levels along with a substantial improvement in the limiting breakdown voltage and maximum frequency. It should be noted that the 96 volt d-c breakdown was limited by electric field reach-through of the epitaxial layer.

The invention has been described and an example given to show its performance. There are alternatives and equivalents, within the spirit and intent of the invention, that will occur to a person skilled in the art upon reading the foregoing. For example, the ion implant step could precede the boron predeposition step. Also the ion implant could be accomplished through a thin grown oxide at the bottom of hole 22. Also, the thin oxide and/or the predeposition oxide could be etched away prior to the diffusion step. Accordingly, it is intended that the scope of the invention be limited only by the following claims.

I claim:

1. In the process of fabricating a lateral transistor in a monolithic semiconductor integrated circuit that ordinarily includes vertically arrayed NPN transistors including the steps of:

depositing a first P type dopant material where NPN transistor bases are desired and simultaneously depositing said material in those regions where lateral transistor emitters and collector are desired; and diffusing said first P type dopant into said semiconductor to establish associated regions of P type semiconductor material;

the improvement comprising:

in said depositing step, depositing a second P type dopant material into those regions where lateral transistor collectors are to be created, said second P type dopant being selected to have a higher diffusivity in said silicon during said diffusing step than said first P type dopant whereby after said diffusing step said lateral transistor collectors extend further into said semiconductor than said emitters.

2. The improvement in claim 1 wherein the amount of said second P type dopant is selected so that after said diffusing step said second P type dopant exists in excess of, and to about the samd excess concentration in said silicon as, the doping in said substrate.

3. The improvement of claim 2 wherein said first P type dopant is boron and said second P type dopant is aluminium.

4. The improvement of claim 3 wherein said aluminium is ion implanted.

5. The improvement of claim 4 wherein said boron is applied in the conventional deposit step in an oxide masked diffusion followed by the steps of forming an ion implant resist over the silicon except where lateral transistor collectors are desired, ion implanting aluminium into said silicon, and removing said resist.

* * * * *